US005666719A

United States Patent [19]

Bair

[11] Patent Number: 5,666,719

[45] Date of Patent: Sep. 16, 1997

[54] FEED MECHANISM FOR A TERMINAL APPLICATOR

[75] Inventor: William Herbert Bair, Mechanicsburg, Pa.

[73] Assignee: The Whitaker Corporation, Wilmington, Del.

[21] Appl. No.: 673,973

[22] Filed: Jul. 1, 1996

[51] Int. Cl.[6] .......................... H01R 43/055; H05K 13/02

[52] U.S. Cl. .............................. 29/753; 29/33 M; 29/759; 72/712

[58] Field of Search .................................. 29/33 M, 748, 29/751, 753, 759, 761, 863; 7/100; 72/413, 446, 409.06, 409.14, 712; 226/68

[56] References Cited

U.S. PATENT DOCUMENTS

| | | | |
|---|---|---|---|
| 3,184,950 | 5/1965 | Sitz | 29/753 X |
| 4,025,999 | 5/1977 | Wolyn et al. | 29/753 |
| 4,114,253 | 9/1978 | Loomis et al. | 29/753 X |
| 4,354,790 | 10/1982 | Karl | 29/753 X |
| 4,718,160 | 1/1988 | Bulanda | 29/748 X |
| 4,970,889 | 11/1990 | Phillips et al. | 72/446 |
| 5,289,713 | 3/1994 | Schäfer | 72/446 |
| 5,491,887 | 2/1996 | Quinn | 29/863 X |

FOREIGN PATENT DOCUMENTS

| | | | |
|---|---|---|---|
| 526145 | 2/1954 | Belgium | 29/753 |
| 351962 | 1/1990 | European Pat. Off. | 29/753 |
| 9106138 | 5/1991 | WIPO | 29/753 |

*Primary Examiner*—Peter Vo
*Attorney, Agent, or Firm*—T. J. Aberle

[57] ABSTRACT

A terminal feed mechanism (16) is provided for an applicator (10) for attaching terminals (198) to electrical conductors. The feed mechanism (16) includes first, second, and third pivoting links (34, 36, and 38, respectively), the first and second of which are pivotally coupled by means of gear teeth (52, 54). The second and third links (36, 38) are coupled by an adjustable slide member (84) that is in sliding engagement with the third link (38). The position of the slide member with respect to the third link governs the length of the feed stroke. A feed finger (170) that engages and advances the strip (196) of terminals (198) is carried by another adjusting mechanism (46) that independently controls the feed end point of the feed finger (170).

12 Claims, 6 Drawing Sheets

FEED MECHANISM FOR A TERMINAL APPLICATOR

The present invention relates to applicators for attaching terminals to electrical conductors and more particularly to a feed mechanism for feeding strips of terminals within the applicator during its operation.

BACKGROUND OF THE INVENTION

Feed mechanisms for advancing a strip of terminals in a terminal applicator are either powered by a separate air cylinder or are mechanically coupled to the ram so that movement of the ram effects operation of the feed mechanism. An example of an air cylinder powered feed system is disclosed in U.S. Pat. No. 4,970,889 which issued Nov. 30, 1990 to Phillips et al. While the air cylinder powered feed system is simple and effective, the cylinder is expensive and the system requires a source of compressed air to operate. For this reason feed mechanisms coupled to the ram are preferred in many instances. Such feed mechanisms are usually complex and are difficult to easily adapt for both side feed and end feed applications. Examples of such feed mechanisms are disclosed in U.S. Pat. Nos.: 3,184,950 which issued May 25, 1965 to Sitz; 3,673,847 which issued Jul. 4, 1972 to van de Kerkhof; 5,095,599 which issued Mar. 17, 1992 to Gloe et al.; and 5,483,739 which issued Jan. 16, 1996 to Smith et al. Further, the components of these feed mechanisms are mostly machined parts requiring relatively close tolerances and are expensive to manufacture. Additionally, the adjustments for the length of feed stroke and the end point of the feed are usually interrelated so that one adjustment affects the other thereby adding additional complexity to the adjusting processes.

What is needed is a simplified terminal feed mechanism that is easy to manufacture, uses a minimum of machined parts, and wherein the components are easily adaptable to either side feed or end feed by the user in the field. The feed mechanism should include independent adjustment mechanisms for both length of stroke and end point of feed.

SUMMARY OF THE INVENTION

An applicator is disclosed for attaching terminals to electrical conductors. The applicator has a frame including a base, and a ram coupled to the frame arranged for reciprocating movement along an axis in a first direction toward the base and in a second opposite direction. A feed mechanism is arranged for feeding a strip of terminals during operation of the applicator. The feed mechanism includes first, second, and third links pivotally attached to the frame and having mutually parallel first, second, and third pivot axes, respectively. The first link is coupled to the ram so that during motion of the ram in the first direction the first link is caused to pivot in a first rotational direction. A coupling means is provided for coupling the first and second links together so that when the first link is pivoted in the first rotational direction the second link is caused to pivot in a second rotational direction opposite the first rotational direction. An adjustable stroke mechanism is arranged to couple the second and third links together so that when the second link is pivoted in the second rotational direction the third link is caused to pivot in the first rotational direction. A feed finger assembly is coupled to an end of the third link and includes a feed finger arranged to engage the strip of terminals when the ram moves in the first direction thereby causing the feed finger to move through a feed stroke and advance the strip of terminals.

DESCRIPTION OF THE PREFERRED EMBODIMENT

Figure 1:
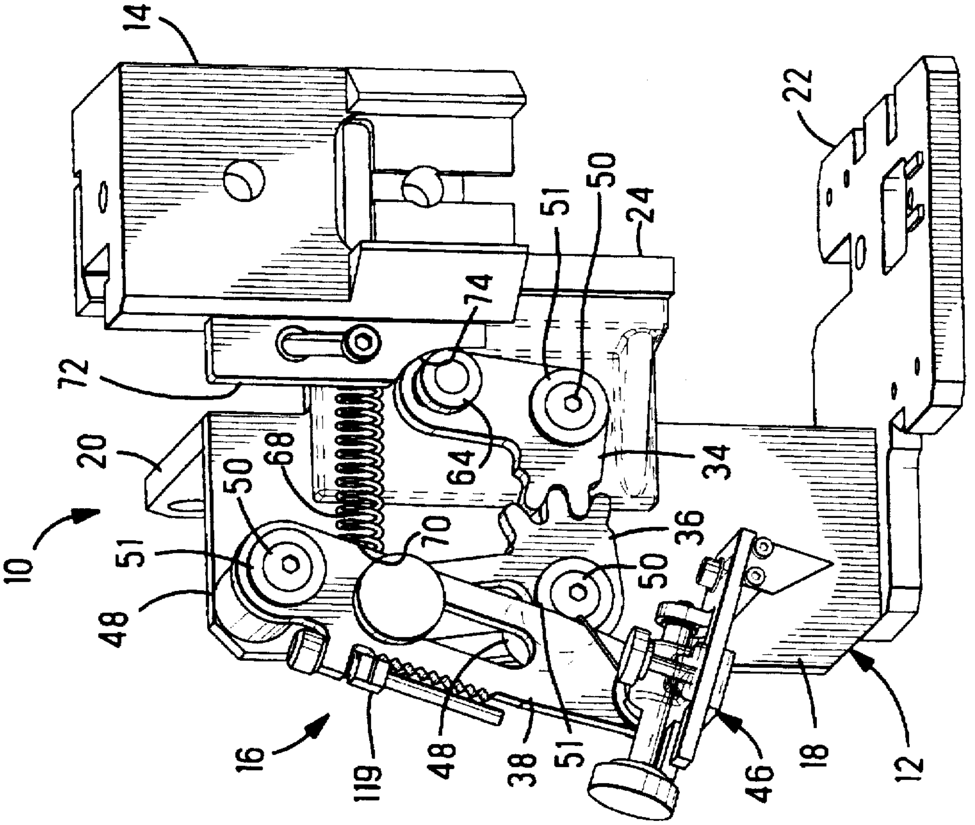
FIG. 1 is an isometric view of a terminal applicator having a feed mechanism incorporating the teachings of the present invention and showing the feed mechanism in side feed configuration.

There is shown in FIG. 1 a terminal applicator 10 having a frame 12, a reciprocating ram 14, and a terminal feed mechanism 16. The frame 12 includes first and second upright plates 18 and 20, respectively, and a base plate 22 which are rigidly attached to each other in an orthogonal arrangement as shown. The frame 12 includes a ramway 24 which guides the ram 14 in its reciprocating movement toward and away from the base plate 22. A crimping anvil and terminal guide track, not shown, typically mount to the base plate and mating terminal and insulation crimping bars, not shown, mount to the ram 14. The crimping bars operationally engage the crimping anvil in the usual manner for attaching the terminals to their respective conductors during operation of the applicator.

Figure 3:
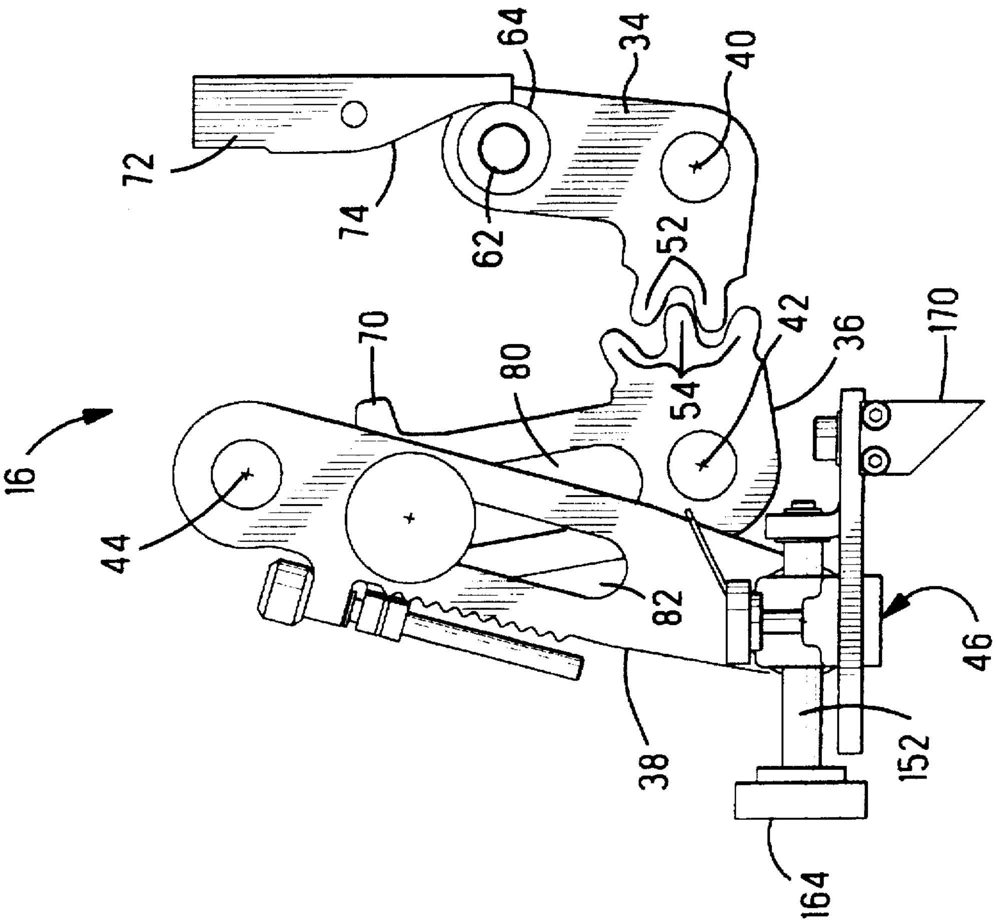
FIGS. 3 and 4 are front and side views, respectively, of the feed mechanism shown in FIG. 1.
Figure 4:
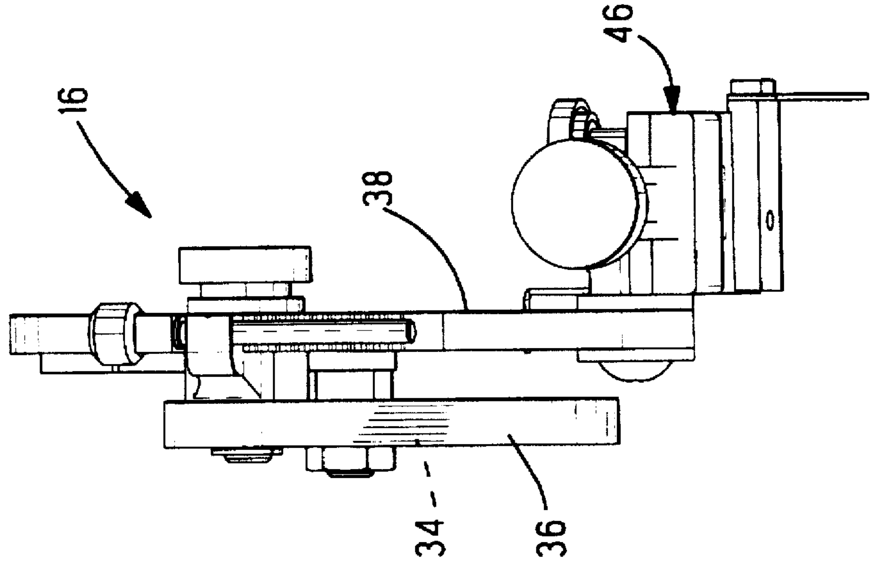
Figure 5:
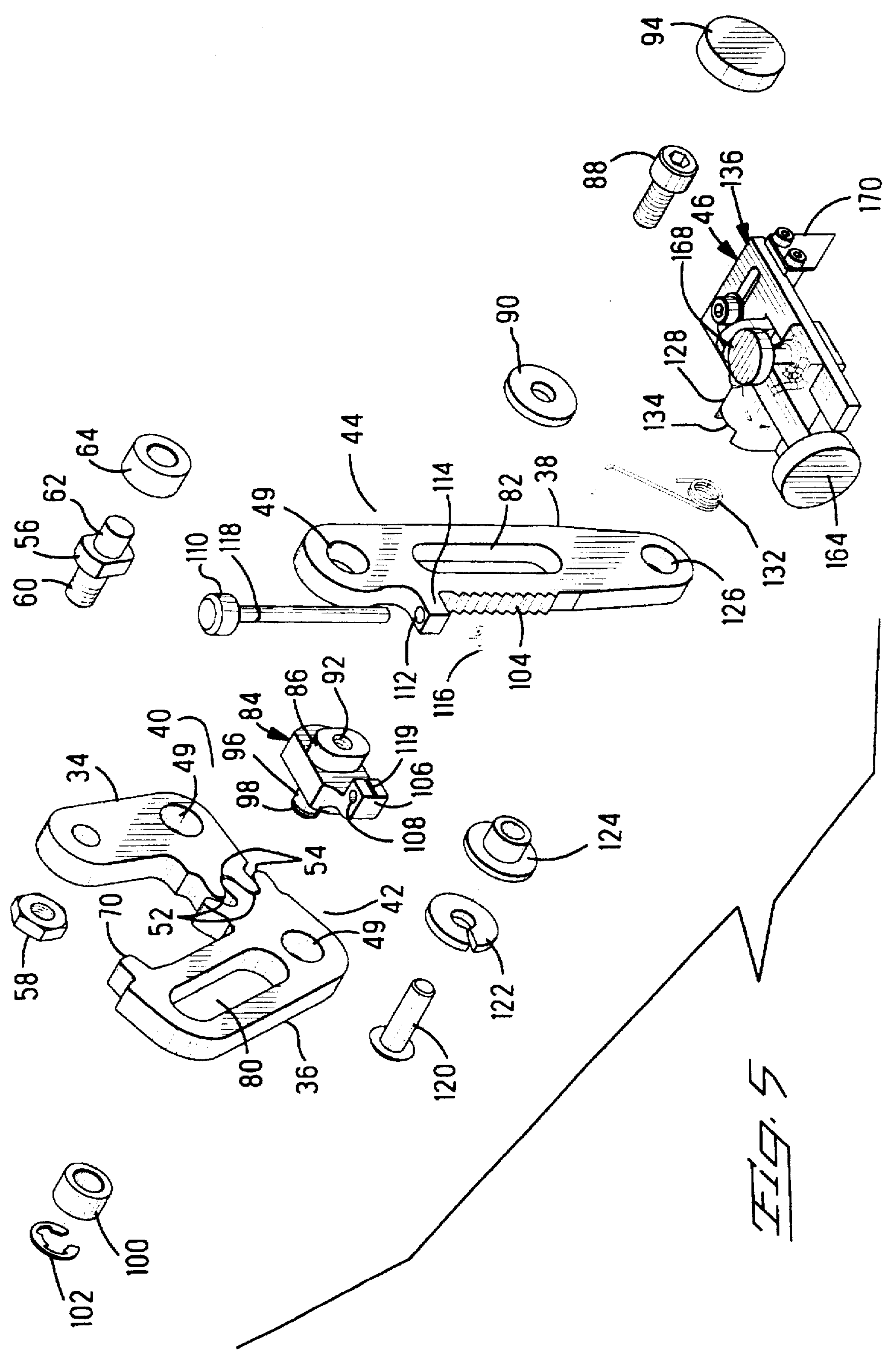
FIG. 5 is an exploded parts view of the feed mechanism shown in FIG. 3.

The feed mechanism 16, as shown in FIGS. 3, 4, 5, and 6, includes first, second, and third links 34, 36, and 38, respectively, each of which is pivotally attached to a respective standoff or boss extending from the frame 12, the three links having the pivot axes 40, 42, and 44, respectively which are mutually parallel. Each of the standoffs has a reduced diameter end that extends into and is a slip fit with a hole 49 in its respective link so that the link is free to pivot. A screw 50 with flat washer 51 is threaded into a hole in the standoff 48 to maintain the link in place, as best seen in FIG. 1. A feed end point adjusting mechanism 46 is pivotally attached to an end of the third link 38 opposite the pivot axis 44, as best seen in FIGS. 3 and 4, and will be described below. The first and second links 34 and 36 each have gear teeth 52 and 54, respectively, extending outwardly into mutual meshing engagement so that when the first link is pivoted in a first rotational direction counterclockwise the second link is made to pivot in a second opposite rotational direction clockwise. As best seen in FIG. 5, the first link 34 includes a stud 56 extending from an end thereof and secured in place by means of a nut tightly threaded onto a threaded end 60 of the stud. Another end 62 of the stud has a follower roller 64 journaled for rotation thereon. As shown in FIGS. 1 and 3, a cam bar 72 having a cam surface 74 is attached to and carried by the ram 14. The follower 64 is in following engagement with the cam surface 74 so that as the ram 14 moves toward the base plate 22, the cam surface 74 causes the follower 64 to move toward the left, as viewed in FIG. 3, thereby causing the first link to pivot counterclockwise about the axis 40 and the second link 36 to pivot clockwise about the axis 42. A return compression spring 68 is arranged between the frame 12 and the second link 36 to return the first and second links to their original positions when the ram and cam bar 72 are retracted. The second link 36 includes a projection 70 that extends into one end of the spring 68 and a similar projection extends from the frame into the other end of the spring to hold the spring in position.

As best seen in FIGS. 3 and 5, the second link includes a first elongated opening 80 and the third link includes a second elongated opening 82. A slide member 84 includes a projection 86 that is a sliding fit with the second elongated opening 82 and is held captive to the third link by means of a screw 88 that extends through a washer 90 and into a threaded hole formed in the projection 86. A knurled cap 94 is attached to the screw 88 by means of an opening in the cap that is a light press fit with the head of the screw. The knurled cap aids in easy manual adjustment of the screw, the purpose of which will be explained below. A diameter 96 extends outwardly from the slide member opposite the projection 86 and includes a groove 98 near its end. A follower roller 100 is journaled for rotation on the diameter 96 and held in place by means of a retaining ring 102 in the groove 98. The follower roller 100 is sized to be closely received within the elongated opening 80. A series of deep serrations 104 are formed along an edge of the third link 38, as shown in FIGS. 3 and 5. The slide member 84 includes an ear 106 extending outwardly therefrom and closely adjacent the edge of the third link having the serrations 104. The ear 106 includes a threaded through hole 108 into which a relatively long thumb screw 110 is threaded. The thumb screw 110 extends through a hole 112 in a flange 114 that projects from the side of the third link 38 and is held in position by means of a retaining ring 116 in a groove 118 in the thumb screw, the head of the screw and the retaining ring straddling the flange 114. An indica mark 119 is formed on a side of the ear 106 adjacent the serrations 104 as a visual aid for adjusting the position of the slide member 84 when changing the length of feed stroke, as will be described below. The feed end point adjusting mechanism 46 is pivotally attached to the end of the third link 38 by means of a screw 120, lock washer 122, and bushing 124. The bushing is a slip fit with a hole 126 formed through the end of the third link. The screw 120 extends through the lock washer and bushing, the hole 126, and into a threaded hole formed in a block 128 of the mechanism 46. A torsion spring 132 is disposed about the screw 120 within a cavity 134 formed in the block 128. One end of the torsion spring is latched against an edge of the cavity 134 and the other end of the spring is latched against the third link 38 so that the feed end point adjusting mechanism 46 is urged to pivot clockwise, as viewed in FIG. 3.

Figure 6:
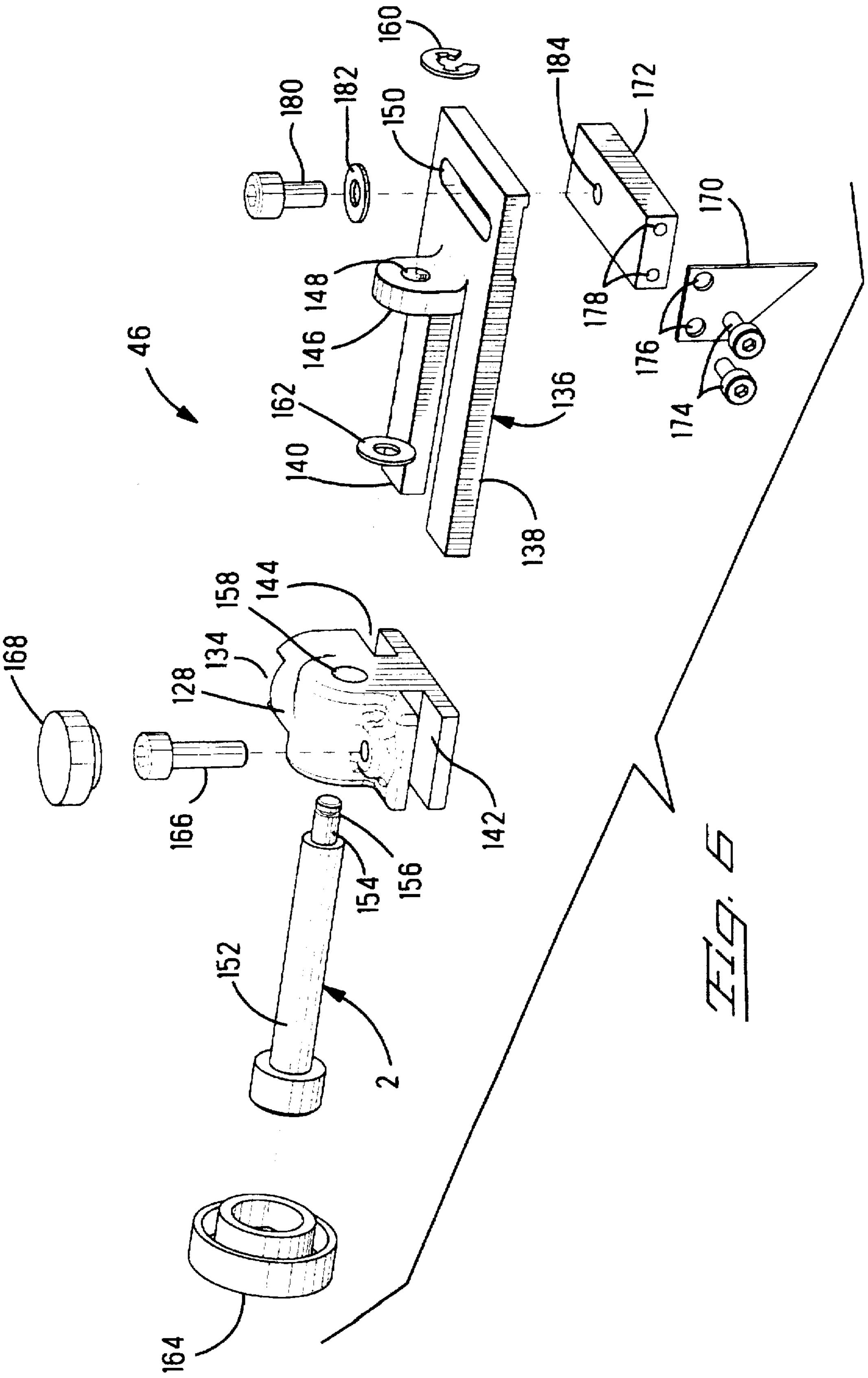
FIG. 6 is an exploded parts view of a portion of the feed mechanism shown in FIG. 5.

As shown in FIG. 6, the feed end point adjusting mechanism 46 includes the block 128 and a slide 136 having two parallel arms 138 and 140 in sliding engagement with two grooves 142 and 144 formed in opposite sides of the block 128. The slide 136 has an upwardly formed tab 146 having a hole 148 formed therein, the axis of the hole being parallel with the arms 138 and 140. An elongated hole 150 is formed through an end of the slide 136 with its longitudinal axis perpendicular to the arms 138 and 140. A relatively long thumb screw 152 having a reduced diameter end 154 and a retaining ring groove 156 extends through and in threaded engagement with a threaded hole 158 formed through the block 128. The reduced diameter 154 extends through a thrust washer 162 and the hole 148, and is held captive by means of a retaining ring 160 in the groove 156. A knurled cap 164 is attached to the screw 152 by means of an opening in the cap that is a light press fit with the head of the screw. The knurled cap aids in easy manual adjustment of the screw when positioning the end feed point. By rotating the thumb screw 152 the slide 136 is made to slide within the grooves 142 and 144 to a desired position. A thumb screw 166 is threaded into a threaded hole formed in the block 128 and intersecting the groove 142. The thumb screw 166 is used to tighten against the arm 138 when securing the slide 136 in position. A knurled cap 168 is attached to the screw 166 by means of an opening in the cap that is a light press fit with the head of the screw. A terminal feed finger 170 is attached to a support block 172 by means of two screws 174 that extend through clearance holes 176 in the feed finger and into threaded holes 178 in the support block. The support block 172 is secured to the slide 136 by means of a screw 180 that extends through a flat washer 182, the elongated hole 150, and into threaded engagement with the hole 184. The lateral position of the feed finger 170 can be easily adjusted by loosing the screw 180, moving the support block to the desired position, and then again tightening the screw 180. As stated above the action of the torsion spring 132 causes the feed end point adjusting mechanism 46 to pivot clockwise, as viewed in FIG. 3. This keeps the feed finger 170 in feeding engagement with the strip of terminals in the terminal guide track. The first, second, and third links 34, 36, and 38, respectively, and the slide 136 are stamped from sheet material thereby minimizing the cost of manufacturing the feed mechanism with respect to prior art feed mechanisms having cast and machined parts.

Figure 7:
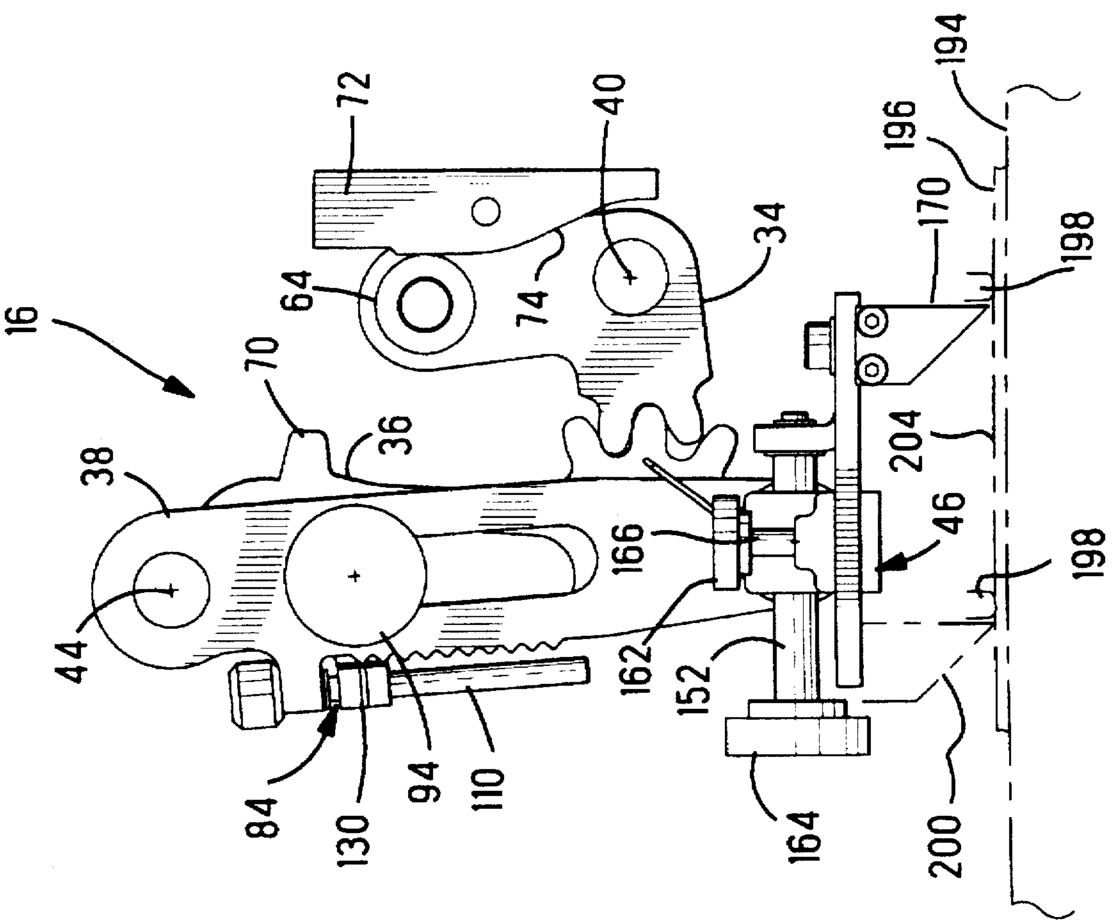
FIGS. 7, 8, and 9 are views similar to that of FIG. 3 showing the feed mechanism in various operating positions.
Figure 9:
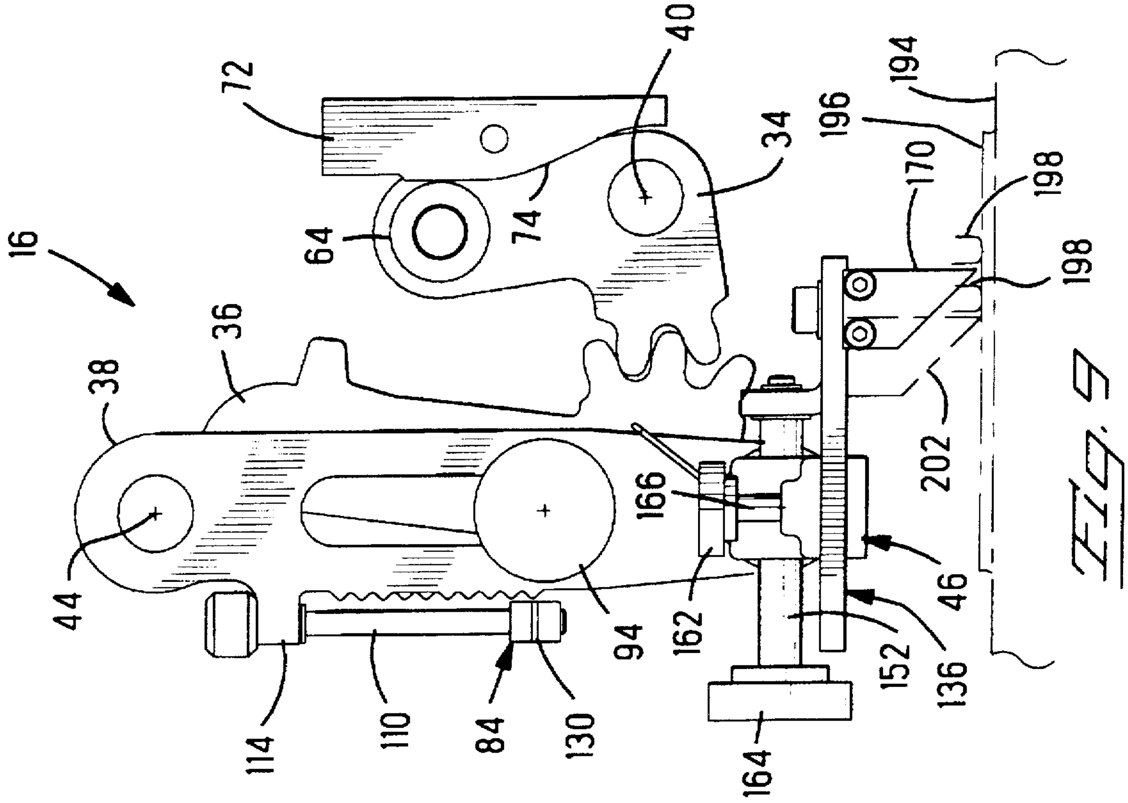
Figure 8:
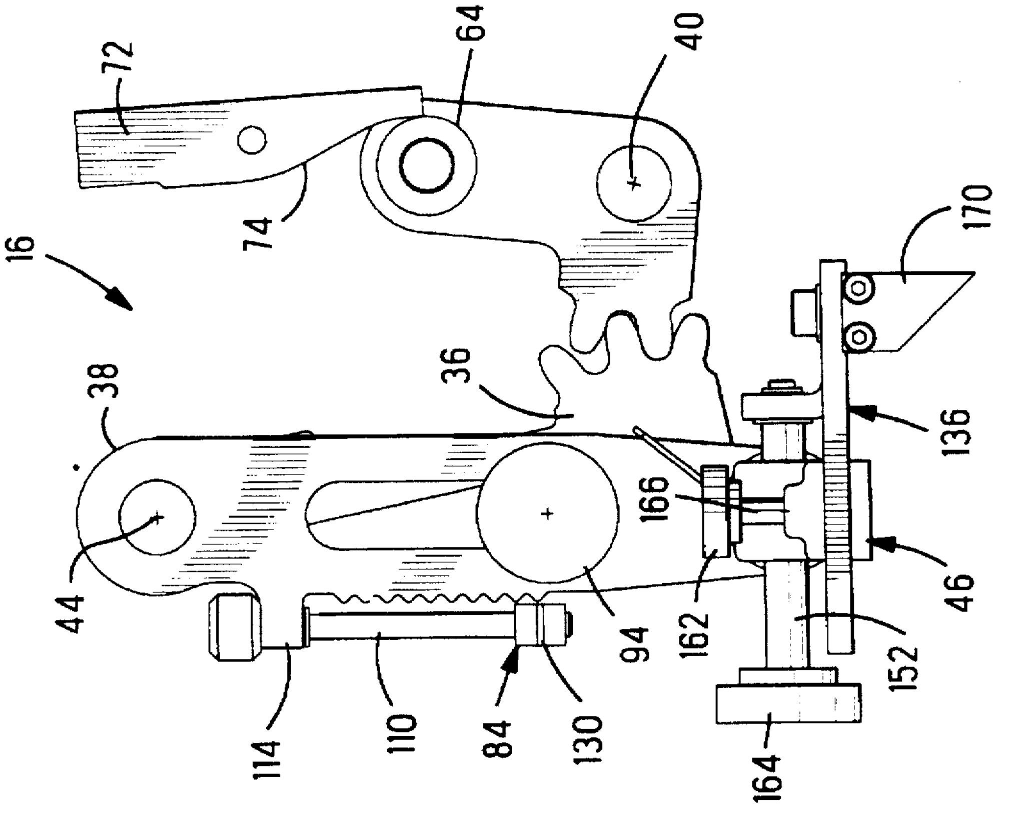

The operation of the feed mechanism 16 will now be described with reference to FIGS. 3, 7, 8, and 9. The slide member 84 is shown in its full up position as viewed in FIGS. 3 and 7. This yields the longest feed stroke. In FIG. 7, a terminal guide track is indicated by the phantom line 194 and has a strip of terminals thereon, indicated by the phantom lines 196 and 198, respectively. The starting position of the feed finger 170, as shown in FIG. 3, is shown in phantom lines 200, in FIG. 7, with the finger against a terminal 198. As the ram 14 moves toward the base plate 22 the cam surface 74 causes the follower 64 to move left thereby pivoting the first link 34 counterclockwise. This causes the second and third links 36 and 38 to pivot clockwise and counterclockwise, respectively, thereby moving the feed finger 170 along a feed path 204 to the position shown in solid lines in FIG. 7. The thumb screw 152 is adjusted to position the terminal 198 directly in line with the crimping tooling, not shown, and the thumb screw 166 is then tightened against the slide 136 locking it in place. When it is desired to shorten the feed stroke the thumb screw 88 is loosened and the thumb screw 110 is adjusted to cause the slide member 84 to move downwardly, as viewed in FIG. 7, a desired amount or to a maximum down position, as shown in FIG. 8, which provides the shortest feed stroke. As the projection 86 of the slide member 84 moves downwardly within the second elongated opening the slide member moves toward the second pivot axis 42 and away from the third pivot axis 44. The starting position of the feed finger 170, as shown in FIG. 8, is shown in phantom lines 202 in FIG. 9, with the finger against a terminal 198. As the ram 14 moves toward the base plate 22 the cam surface 74 causes the follower 64 to move left thereby pivoting the first link 34 counterclockwise. This causes the second and third links 36 and 38 to pivot clockwise and counterclockwise, respectively, thereby moving the feed finger 170 to the position shown in solid lines in FIG. 9. The thumb screw 166 is loosened and the thumb screw 152 is then adjusted to position the terminal 198 directly in line with the crimping tooling, not shown, and the thumb screw 166 is then tightened against the slide 136 locking it in place. When it is desired to lengthen the feed stroke the thumb screw 88 is loosened and the thumb screw 110 is adjusted to cause the slide member 84 to move upwardly, as viewed in FIG. 8, a desired amount or to a maximum up position, as shown in FIG. 3, which provides the longest feed stroke. As the projection 86 of the slide member 84 moves upwardly within the second elongated opening the slide member moves toward the third pivot axis 42 and away from the second pivot axis 44. Any desired length of feed stroke between that shown in FIGS. 7 and 9 can be achieved in this manner.

Figure 2:
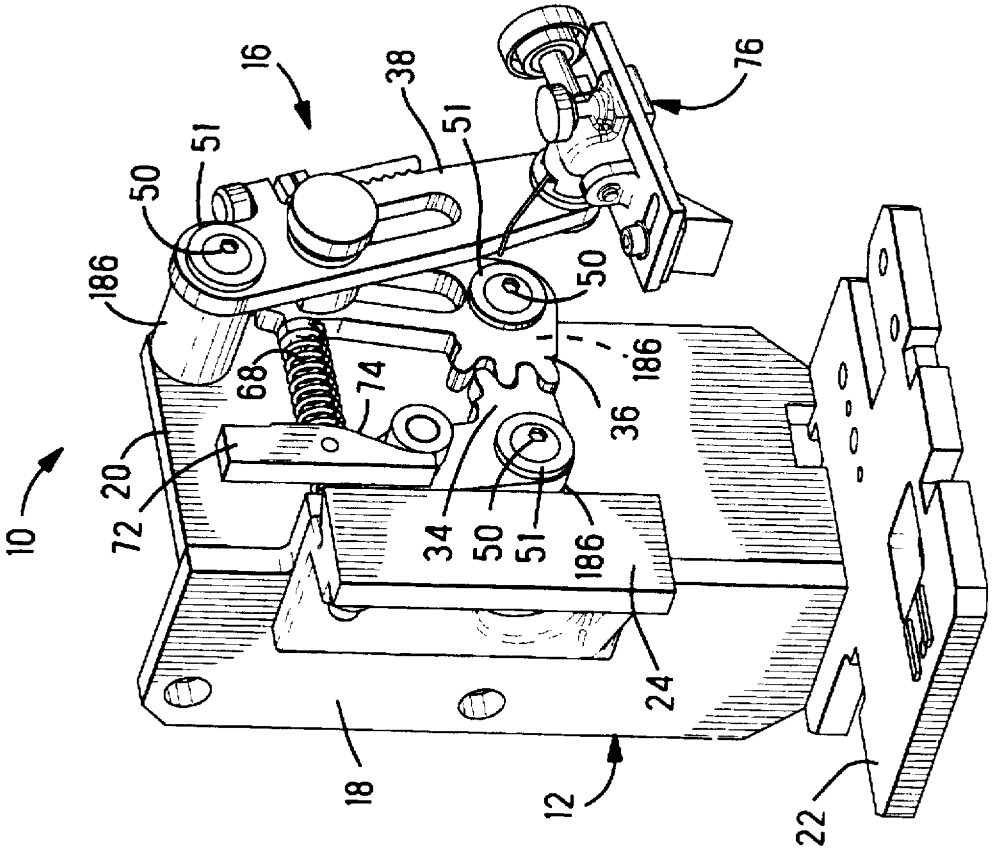
FIG. 2 is a view similar to that of FIG. 1 showing the feed mechanism in end feed configuration.

The feed mechanism 16 has been illustrated and described in side feed configuration, as shown in FIG. 1. However, the component parts of the feed mechanism 16 can easily be rearranged on the frame 12 in end feed configuration, as shown in FIG. 2. In this case, the identical parts are used including the first, second, and third links 34, 36, and 38, respectively and the feed end point adjusting mechanism 46. The only differences being that the three links are pivotally attached to the three standoffs or bosses 186 that extend from the upright plate 20, and the cain bar 72 is mounted on a different side of the ram 14. In all other respects the two configurations are identical in structure. The operation of the feed mechanism when in the end feed configuration is similar to that described above except that the first, second, and third links 34, 36, and 38, respectively, pivot in rotational directions that are opposite to those occurring in the side feed configuration. All other Operational characteristics are identical in both configurations.

An important advantage of the present invention is that the components of the feed mechanism are reconfigurable between side feed and end feed thereby reducing the quantity of different parts that must be manufactured and inventoried. Additionally, this conversion of the applicator from one configuration to the other can be accomplished in the field by the end user. Another important advantage is that the major operating components are manufactured by stamping and forming thereby significantly reducing manufacturing costs. Further, the adjusting mechanisms for the feed stroke length and for the feed end point are independent resulting in a simple easily performed adjustment procedure.

We claim:

1. An applicator for attaching terminals to electrical conductors having a frame including a base, a ram coupled to said frame and arranged for reciprocating movement along an axis in a first direction toward said base and in a second opposite direction, and a feed mechanism arranged for feeding a strip of said terminals during operation of said applicator, said feed mechanism comprising:

(1) first, second, and third links pivotally attached to said frame and having mutually parallel first, second, and third pivot axes, respectively, said first link being coupled to said ram so that during motion of said ram in said first direction said first link is caused to pivot in a first rotational direction;

(2) coupling means coupling said first and second links together so that when said first link is pivoted in said first rotational direction said second link is caused to pivot in a second rotational direction opposite said first rotational direction;

(3) an adjustable stroke mechanism coupling said second and third links together so that when said second link is pivoted in said second rotational direction said third link is caused to pivot in said first rotational direction; and (4) a feed finger assembly coupled to said third link having a feed finger arranged to engage said strip of terminals, so that when said ram moves in said first direction said feed finger moves through a feed stroke thereby advancing said strip of terminals.

2. The feed mechanism according to claim 1 wherein said second link is between said third link and said frame.

3. The feed mechanism according to claim 1 wherein said coupling means comprises gear teeth formed in an edge of said first link in engagement with mating gear teeth formed in an edge of said second link.

4. The feed mechanism according to claim 1 wherein said adjustable stroke mechanism comprises a first elongated opening in said second link and a slide member slidingly coupled to said third link, said slide member having a follower in tracking engagement with said first elongated opening so that when said second link is pivoted in said second rotational direction said follower is carried therewith thereby effecting said movement of said third link in said first rotational direction.

5. The feed mechanism according to claim 4 wherein said third link includes a second elongated opening and said slide member includes a projection in sliding engagement with said second elongated opening and arranged so that when said projection is moved in one direction in said second elongated opening said slide member moves toward said second pivot axis and away from said third pivot axis thereby shortening said feed stroke and when said projection is moved in an opposite direction in said second elongated opening said slide member moves away from said second pivot axis and toward said third pivot axis thereby lengthening said feed stroke.

6. The feed mechanism according to claim 5 wherein said slide member includes a threaded hole therein and said projection is lockable in any position along said second elongated opening by means of a screw extending through said second elongated opening and into threaded engagement with said threaded hole.

7. The feed mechanism according to claim 6 wherein said third link includes a boss adjacent said third pivot axis having an adjusting screw extending through said boss and in engagement with said slide member and arranged so that when said adjusting screw is rotated one way said projection is made to move in said one direction within said second elongated opening and when said adjusting screw is rotated the other way said projection is made to move in said opposite direction within said second elongated opening.

8. The feed mechanism according to claim 1 wherein said first, second, and third links are positionable with respect to said frame in a first operating position wherein said movement of said ram in said first direction causes said first link to pivot counterclockwise for effecting side feed of said strip of terminals and in a second operating position wherein said movement of said ram in said first direction causes said first link to pivot clockwise for effecting end feed of said strip of terminals.

9. The feed mechanism according to claim 1 wherein said coupling of said first link to said ram is effected by means of a cam secured to said ram and a follower attached to said first link in following engagement with said cam so that when said ram moves in said first direction said cam moves said follower thereby causing said first link to pivot in said first rotational direction.

10. The feed mechanism according to claim 1 wherein said feed finger assembly comprises a block pivotally attached to said third link, a slide in sliding engagement with said block, and a feed finger coupled to and carried by said slide for moving said terminals along a feed path.

11. The feed mechanism according to claim 10 including a support member between said feed finger and said slide wherein said feed finger is adjustably positionable in a direction that is perpendicular to said feed path.

12. The feed mechanism according to claim 11 including an adjusting screw in threaded engagement with said block and arranged to move said slide so that said feed finger moves along said feed path.

* * * * *